US008688865B2

(12) United States Patent
Luo (10) Patent No.: US 8,688,865 B2
(45) Date of Patent: Apr. 1, 2014

(54) DEVICE IDENTIFIER ASSIGNMENT

(75) Inventor: Wei Luo, Marlboro, NY (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/537,806

(22) Filed: Jun. 29, 2012

(65) Prior Publication Data

US 2013/0262710 A1 Oct. 3, 2013

Related U.S. Application Data

(60) Provisional application No. 61/618,049, filed on Mar. 30, 2012.

(51) Int. Cl.
*G06F 13/36* (2006.01)
(52) U.S. Cl.
USPC ................................................ 710/8; 710/72
(58) Field of Classification Search
None
See application file for complete search history.

(56) References Cited

U.S. PATENT DOCUMENTS

| 5,892,929 | A * | 4/1999 | Welker ........................ 710/107 |
| 6,378,018 | B1 * | 4/2002 | Tsern et al. ................... 710/313 |
| 7,346,051 | B2 * | 3/2008 | Nakayama et al. ........... 370/386 |
| 7,533,106 | B2 * | 5/2009 | Magdeburger et al. ............... 1/1 |
| 7,830,906 | B2 * | 11/2010 | Satoh et al. ................... 370/423 |
| 2004/0088463 | A1 * | 5/2004 | Krishnamurthy et al. .... 710/301 |
| 2009/0240859 | A1 * | 9/2009 | Hsieh ............................ 710/110 |
| 2013/0122901 | A1 * | 5/2013 | Chen et al. .................... 455/434 |

OTHER PUBLICATIONS

MIPI Alliance, Mobile Platform Architectures using MIPI Standards, 2011, pp. 1-18.*
Wilkerson, et al., "A Look at the MIPI RFFE standard", EE Times-Asia, BUS Interface, Mar. 2011, pp. 1-3.
MIPI, Mobile Industry Processor Interface, MIPI Alliance Specification for RFFE, Version 0.70.00 Revision 0.03, Oct. 16, 2009, pp. 1-90.

* cited by examiner

*Primary Examiner* — Cheng-Yuan Tseng
(74) *Attorney, Agent, or Firm* — Thomas|Horstemeyer, LLP (57) ABSTRACT

A command to change a device identifier is output to a first slave device and to a second slave device using a shared data line. The first slave includes a first device identifier, and the second slave device includes a second device identifier. A value for the first device identifier is replaced within a time period using the shared data line. During the same period of time, a value for the second device identifier is maintained.

24 Claims, 5 Drawing Sheets

DEVICE IDENTIFIER ASSIGNMENT

CROSS REFERENCE TO RELATED APPLICATIONS

This application claims priority to copending U.S. provisional application entitled "CELLULAR BASEBAND PROCESSING" assigned Ser. No. 61/618,049, filed Mar. 30, 2012, the entirety of which is hereby incorporated by reference herein.

BACKGROUND

In a radio frequency front end (RFFE) of a wireless communication device, a master device may be in communication with several slave devices, such as power amplifiers, modulators, mixers, and other components. As such, various schemes may be used for the master device to be able to communicate with the slave devices.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

The present disclosure is directed towards systems, apparatus, and methods for assigning identifiers to slave devices. A non-limiting example follows. A master device for a radio frequency front end (RFFE) of a wireless communication device, such as a cellular telephone, is in data communication with multiple slave devices through a shared data line. The master device outputs an enable signal to a first one of the slave devices through a first enable line and a disable signal to a second one of the slave devices through a second enable line. The master device then outputs a command to change a device identifier using the shared data line. Because at least a portion of the second slave device is disabled while at least a portion of the first slave device is enabled, the first slave device changes its device identifier, while an initial device identifier in the second slave device is maintained. In the following discussion, a general description of the system and its components is provided, followed by a discussion of the operation of the same.

Figure 1:
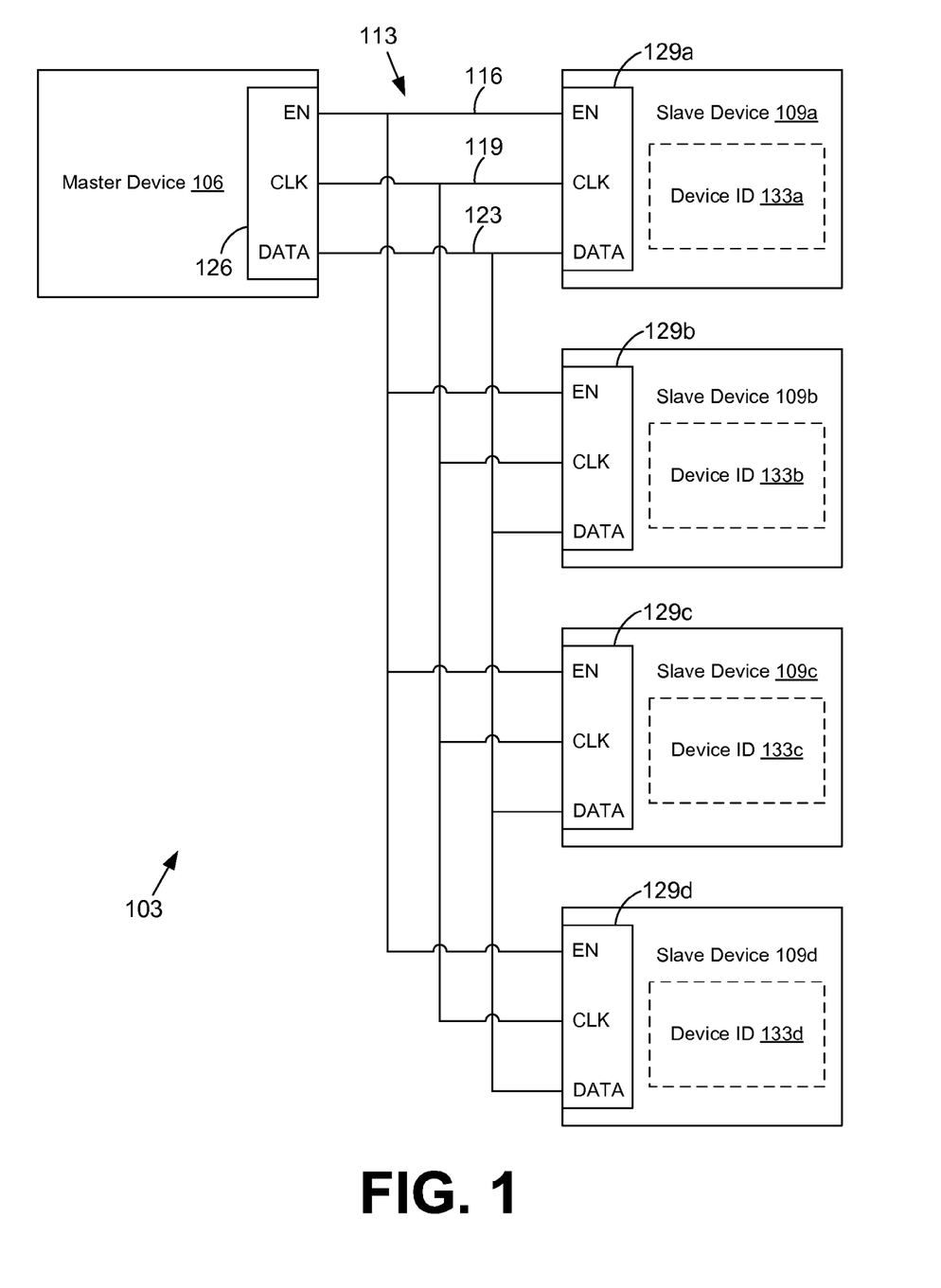
FIG. 1 is a drawing of a portion of a communication device according to various embodiments of the present disclosure.

With reference to FIG. 1, shown is a drawing of a portion of a communication device 103 according to various embodiments of the present disclosure. The communication device 103 may be configured to transmit and/or receive wireless data from a base station or another communication device 103. To this end, the communication device 103 may be embodied in the form of, for example, a processor-based system such as a computing device or other type of device. Such a computing device may be embodied in the form of a cellular telephone, a web pad, a tablet computer system, a laptop computer, a netbook, an electronic book reader, a music player, a portable gaming device, one-way or two-way radio, or any other device with like capability.

The portion of the communication device 103 shown may be, for example, in a radio frequency front end (RFFE) for the communication device 103. The portion of the communication device 103 may include a master device 106 in data communication with a first slave device 109a, a second slave device 109b, a third slave device 109c, and a fourth slave device 109d through a data bus 113. Although FIG. 1 shows four slave devices 109a-109d, it is understood that fewer or greater numbers of slave devices 109a-109d may be in communication with the master device 106.

The data bus 113 may include multiple lines, such as printed circuit board (PCB) traces, wires, or any other type of interconnect to facilitate data communication between the master device 106 and the slave devices 109a-109d. For example, the data bus 113 may include an enable line 116, a clock line 119, and a shared data line 123.

The master device 106 may control various functionality of the slave devices 109a-109d. As such, in various embodiments the master device 106 may be a portion of a baseband integrated circuit (BBIC) and/or a radio frequency integrated circuit (RFIC) for the RFFE of the communication device 103. Additionally, the master device 106 may include a master interface 126 to facilitate the outputting and inputting of data. For instance, the master interface 126 may include an enable pin, a clock pin, a data pin, and possibly other connection points. The enable pin may be communicatively coupled to the enable line 116 to provide an enable signal and a disable signal. In some embodiments, the enable pin may be embodied in the form of, for example, a general purpose input/output (GPIO) pin. The data pin may be communicatively coupled to the shared data line 123 to output commands and other data to the slave devices 109a-109b. The clock pin may be communicatively coupled to the clock line 119 to coordinate and synchronize the transmission of data to and from the master device 106 and slave devices 109a-109d. As may be appreciated, the clock signal 119 may be omitted in embodiments that use a communication scheme in which a clock signal is not used.

The slave devices 109a-109b may be devices that are under at least partial control by the master device 106. In various embodiments, each of the slave devices 109a-109d may be devices that are in separate packaging from each other and/or the master device 106. In various alternative embodiments, one or more of the slave devices 109a-109d and/or the master device 106 may be components that share the same packaging. In various embodiments, each of the slave devices 109a-109d may be, as non-limiting examples, a power amplifier, a voltage supplier, an antenna switcher, an antenna tuner, or any other type of component used in an RFFE and being under at least partial control by the master device 106.

The slave devices 109a-109d may include corresponding slave interfaces 129a-129d to facilitate the outputting and inputting of data to and from the master device 106 or other devices. For example, each of the slave interfaces 129a-129d may include an enable pin, a clock pin, a data pin, and possibly other connection points. Each enable pin may be communicatively coupled to the enable line 116 to obtain the enable and the disable signal from the master device 106. In response to obtaining a disable signal from the enable line 116, at least a portion of the slave device 109a-109d may be disabled. In this sense, the at least a portion of the slave device 109a-109d may power down or become non-responsive. For example, in various embodiments, receiving a disable signal may cause at least portions of the slave interfaces 129a-129d to become disabled and unresponsive to data being received using the shared data line 123. Additionally, the enable pin for the slave interfaces 129a-129d may be embodied in the form of an input/output voltage supply (VIO) pin. VIO pins may, for example, provide a voltage supply for the slave interfaces 129a-129d and/or power up or power down the slave interfaces 129a-129d.

Each data pin may be communicatively coupled to the shared data line 123 and receive and/or transmit commands or other data using the shared data line 123. Additionally, each clock pin may be communicatively coupled to the clock line 119 and receive the clock signal from the master device 106 for data signal coordination and synchronization.

Each of the slave devices 109a-109d may include a device identifier 133a-133d therein. Each slave device 109a-109d may use its corresponding device identifier 133a-133d to determine whether data, commands, etc., on the shared data line 123 are intended for use by the particular slave device 109a-109d. For instance, the master device 106 may output values corresponding to the second device identifier 133b (corresponding to the second slave device 109b) followed by a command. The second slave device 109b may recognize that that value corresponds to device identifier 133b and may thus process the command. The first slave device 109a, the third slave device 109c, and the fourth slave device 109d may not recognize the value corresponding to the second device identifier 133b and may thus ignore the command.

The devices identifiers 133a-133d may be programmed with an initial identifier value by manufacturers of the slave devices 109a-109d. For instance, the initial identifier values may be stored in non-volatile memory so that the device identifiers 133a-133d load the initial identifier values upon the slave devices 109a-109d being powered up. Thus, it may be the case that the slave devices 109a-109d that are from the same manufacturer and have the same model number may have the same values as device identifiers 133a-133d.

In various embodiments, the device identifiers 133a-133d may be programmable by the master device 106 or by other devices. For example, the device identifiers 133a-133d may be programmable by the master device 106 by sending a "change device identifier" command to the slave devices 109a-109d. In response, a replacement identifier value may be stored in an appropriate register within the slave device 109a-109d.

Next, a general description of the operation of the various components of the portion of the communication device 103 is provided. In the present example, it is assumed that the first slave device 109a and the second slave device 109b are from the same manufacturer and have the same device model number. Additionally, it is assumed that the third slave device 109c and the fourth slave device 109d are from the same manufacturer and have the same device model number.

Upon the communication device 103 being powered up, the master device 106 and the slave devices 109a-109d may begin their respective initialization sequences. For example, the slave devices 109a-109d may initialize their device identifiers 133a-133d to be the values that were set by the manufacturers of the slave devices 109a-109d. Because the first slave device 109a and the second slave device 109b in the present example are from the same manufacturer and have the same device model number, the initial device identifier values for the first slave device 109a and the second slave device 109b may be identical. Similarly, because the third slave device 109c and the fourth slave device 109d are from the same manufacturer and have the same device model number, the initial device identifier values for the third slave device 109c and the fourth slave device 109d may be identical.

The master device 106 may transmit a command sequence to one or more of the slave devices 109a-109d for various purposes. For example, the command sequence may instruct one or more of the slave devices 109a-109d to change settings or perform a particular function as determined by the command sequence. To this end, the master device 106 may output an enable signal on the enable pin, which is in communication with the enable line 116. Because the enable line 116 is connected to the enable pin of all of the slave interfaces 129a-129d, the enable signal is received by the slave devices 109a-109d. By receiving the enable signal, the slave devices 109a-109d may respond by enabling (i.e., powering up) at least portions of the slave devices 109a-109d. For instance, the slave interfaces 129a-129d may become enabled.

With the enable signal asserted, the master device 106 may transmit a command sequence on the shared data line 123 synchronized using the clock signal on the clock line 119. As a non-limiting example, the command sequence may include a value corresponding to the device identifier 133a-133d for the particular slave device 109a-19d for which the command sequence is intended. Following the device identifier 133a-133d may be the particular command and possibly data that is intended to be transmitted to the one or more of the slave devices 109a-109d.

As previously mentioned, the device identifier 133a for the first slave device 109a and the device identifier 133b for the second slave device 109b in the present example are identical. Thus, the initial device identifiers 133a-133b that are programmed by the manufacturer may be identical. As such, a command sequence intended to be processed by the first slave device 109a may also be processed by the second slave device 109b. In many cases, however, it may be undesirable for both the first slave device 109a and the second slave device 109b to process the command sequence. Because the third slave device 109c and fourth slave device 109d have device model numbers and thus initial device identifiers 133c-133d that are different from those of the first slave device 109a and second slave device 109b, a command sequence intended for the first slave device 109a and/or second slave device 109b may be ignored by the third slave device 109c and the fourth slave device 109d.

Figure 2:
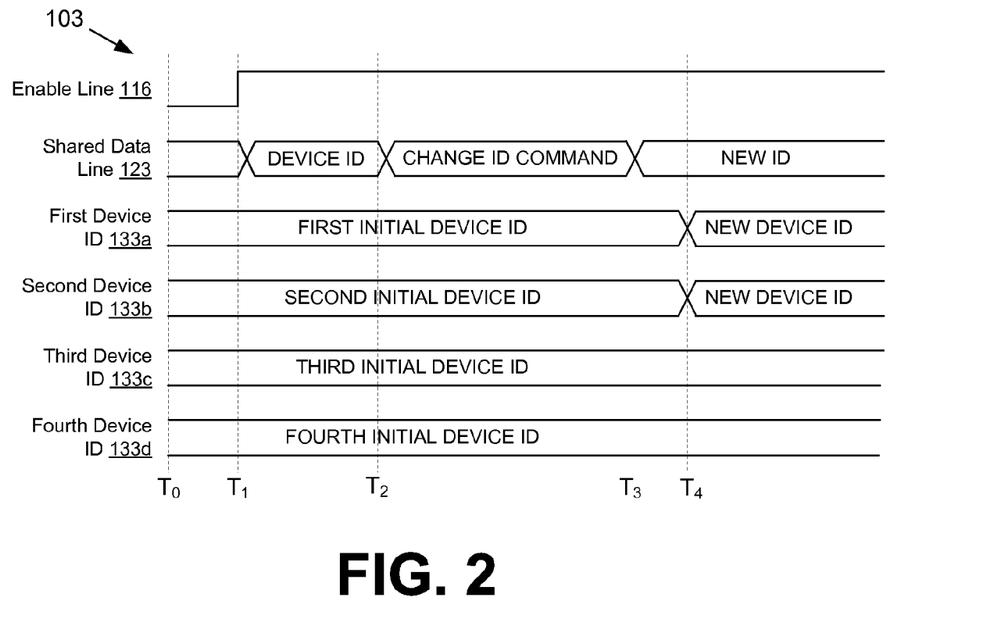
FIG. 2 is a drawing of a timing diagram illustrating an example of functionality executed in the communication device of FIG. 1 according to various embodiments of the present disclosure.

Turning now to FIG. 2, shown is a drawing of a timing diagram illustrating an example of functionality executed in the communication device 103 of FIG. 1 according to various embodiments of the present disclosure. The timing diagram of FIG. 2 provides merely an example of the many different types of functionality that may be executed in the communication device 103 as described herein. In particular, the timing diagram shows graphical representations of functionality regarding the enable line 116, the shared data line 123, the first device identifier 133a in the first slave device 109a (FIG. 1), the second device identifier 133b in the second slave device 109b (FIG. 1), the third device identifier 133c in the third slave device 109c (FIG. 1), and the fourth device identifier 133d in the fourth slave device 109d (FIG. 1).

Beginning at time $T_0$, a disable signal is being asserted on the enable line 116. Additionally, the first device identifier 133a, the second device identifier 133b, the third device identifier 133c, and the fourth device identifier 133d are at their initial values that were set, for example, by their respective manufacturers.

At time $T_1$, an enable signal is asserted on the enable line 116, and a value corresponding to the first device identifier 133a is output to the shared data line 123. After the data identifying the first device identifier 133a has been output to the shared data line 123, the first slave device 109a (FIG. 1) recognizes that an upcoming command is intended for the first slave device 109a. However, because the second slave device 109b (FIG. 1) in the present example has a device identifier 133b that is identical to the device identifier 133a for the first slave device 109a, the second slave device 109b also recognizes that the upcoming command sequence is intended for the second slave device 109b.

At time $T_2$, a command is output to the shared data line 123. In the present example, the command is to change the device identifier 133a. In response to this command being output to the shared data line 123, both the first slave device 109a and the second slave device 109b prepare to change the values of their respective device identifiers 133a-133b to the upcoming value that will be output on the shared data line 123.

At time $T_3$, the value for the replacement device identifier 133a is output on the shared data line 123. Upon receiving the value on the shared data line 123, both the first slave device 109a and the second slave device 109b change their device identifiers 133a-133b to be the value that was output on the shared data line 123. Thus, at time $T_4$, the first device identifier 133a and the second device identifier 133b for the first slave device 109a and the second slave device 109b have been changed to the new value. Additionally, the third device identifier 133c and the fourth device identifier 133d for the third slave device 109c (FIG. 1) and the fourth slave device 109d (FIG. 1) have maintained their initial values.

Figure 3:
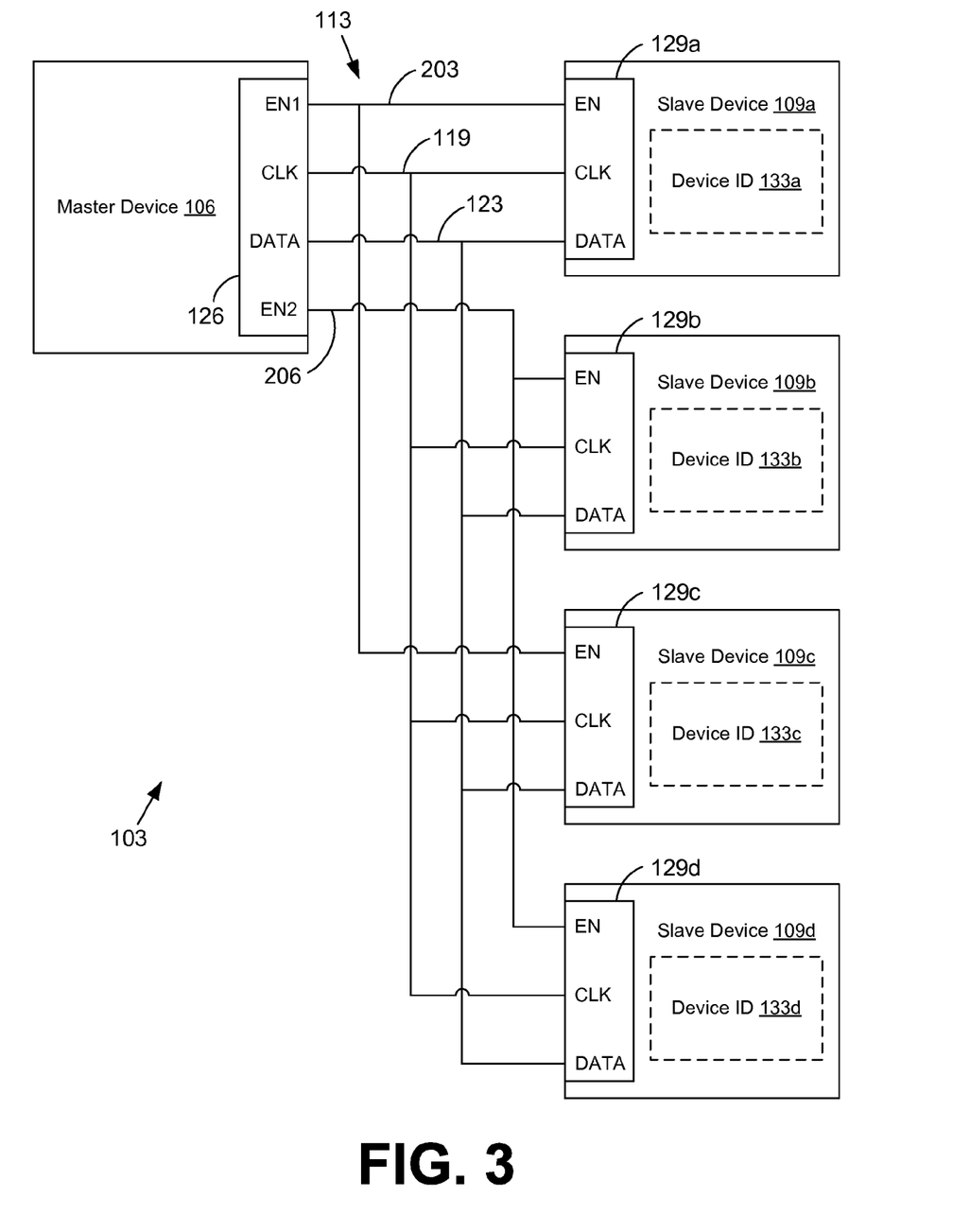
FIG. 3 is a drawing of a portion of an alternative embodiment of the communication device of FIG. 1 according to various embodiments of the present disclosure.

Turning now to FIG. 3, shown is a drawing of a portion of an alternative embodiment of the communication device 103 according to various embodiments of the present disclosure. The embodiment shown in FIG. 3 is similar to the embodiment shown in FIG. 1. The portion of the communication device 103 includes a master device 106 and a first slave device 109a, a second slave device 109b, a third slave device 109c, and a fourth slave device 109d in data communication through the data bus 113. The data bus 113 shown in FIG. 3 is similar to the data bus shown in FIG. 1. However, in the embodiment shown in FIG. 3, the data bus 113 now includes a first enable line 203 and a second enable line 206.

Additionally, the master interface 126 of the master device 106 now includes a first enable pin and a second enable pin in communication with the first enable line 203 and second enable line 206, respectively. As will be discussed later, the first enable pin and the second enable pin may provide an enable signal and disable signal. In some embodiments, the first enable pin and/or second enable pin may be embodied in the form of a GPIO pin or other type of connection point. The first enable pin of the master interface 126 is in data communication with the enable pins of the first slave interface 129a and the third slave interface 129c through the first enable line 203. Additionally, the second enable pin of the master interface 126 is in data communication with the enable pin of the second slave interface 129b and the fourth slave interface 129d through the second enable line 206.

Next, a general description of the operation of the various components of the portion of the communication device 103 of FIG. 3 is provided. In the present example, it is assumed that the first slave device 109a and the second slave device 109b are from the same manufacturer and have the same device model number. Additionally, it is assumed that the third slave device 109c and the fourth slave device 109d are from the same manufacturer and have the same device model number.

Upon the communication device 103 being powered up, the master device 106 and slave devices 109a-109d may begin their initialization sequences described above with respect to FIG. 1. Thus, the slave devices 109a-109d may initialize their respective device identifiers 133a-133d to have the values that were set by the manufacturers of the slave devices 109a-109d. Because the first slave device 109a and the second slave device 109b in the present example are from the same manufacturer and have the same device model number, the initial device identifier values for the first slave device 109a and the second slave device 109b may be identical. Similarly, because the third slave device 109c and the fourth slave device 109d are from the same manufacturer and have the same device model number, the initial device identifier values for the third slave device 109c and the fourth slave device 109d may be identical.

Because the first slave device 109a and the second slave device 109b have identical initial device identifiers values, the master device 106 may assign a new device identifier value to one or both of the slave devices 109a-109b. Assigning the new device identifier value to one or both of the slave devices 109a-109b may facilitate the master device 106 controlling the first slave device 109a, for example, without inadvertently controlling with the second slave device 109b. In the following example, the master device 106 is to assign a new device identifier 133a to the first slave device 109a, while the master device 106 maintains the initial device identifier 133b in the second slave device 109b.

The master device 106 may assert an enable signal on the first enable line 203 using the first enable pin of the master interface 126. Because the first enable line 203 is connected to the enable pin of the first slave interface 129a of the first slave device 109a and to the enable pin of the third slave interface 129c of the third slave device 109c, the first slave device 109a and the third slave device 109c may respond by enabling (i.e., powering up) at least portions of their respective devices. For instance, at least portions of the first slave interface 129a and the third slave interface 129c may be powered up. At approximately the same time, the master device 106 may also assert a disable signal on the second enable line 206 using the second enable pin of the master interface 126. Because the second enable line 206 is in communication with the enable pin of the second slave interface 129b of the second slave device 109b and with the enable pin of the fourth slave interface 129d of the fourth slave device 109d, the second slave device 109b and the fourth slave device 109d may respond by disabling (e.g., powering down) at least a portion of their respective devices. For example, portions of the second slave interface 129b and the fourth slave interface 129d may be powered down.

Thereafter, the master device 106 may transmit a value corresponding to the first device identifier 133a on the shared data line 123 synchronized by a clock on the clock line 119. Because at least portions of the first slave interface 129a and the third slave interface 129c may be powered up, the first slave device 109a and the third slave device 109c may receive and process the data corresponding to the first device identifier 133a. At least portions of the second slave interface 129b and the fourth slave interface 129d may have been powered down, so the second slave device 109b and the fourth slave device 109d may not receive and process the value corresponding to the first device identifier 133a.

Upon receiving the value corresponding to the first device identifier 133a, the first slave device 109a and the third slave device 109c may determine whether the value received corresponds to their respective device identifiers 133a and 133a. Because the value received corresponds to the first device identifier 133a in the present example, the first slave device 109a may recognize that an upcoming command to be received on the shared data line 123 is intended for the first slave device 109a. To the contrary, the second slave device 109b may ignore the upcoming command to be received because it did not recognize the value of the first device identifier 133a that was previously received.

Thereafter, the master device 106 may transmit a command on the shared data line 123 to change the first device identifier 133a. After transmitting the command, the master device 106 may transmit the particular value to which the first device identifier 133a is to be changed. The first slave device 109a may receive the command and change the first device identifier 133a to the value received on the shared data line 123. Thus, the first slave device 109a may change its first device identifier 133a to a new value, while the initial values of the second device identifier 133b, the third device identifier 133c, and the fourth device identifier 133d remain at their initial values.

Additionally, the value of the third device identifier 133c may be changed using a similar process described above with respect to changing the value of the first device identifier 133a. In changing the value of the third device identifier 133c, a value corresponding to the third device identifier 133c may preface the command for the device identifier 133c to be changed. Thus, the third slave device 109c may process the command, and the first slave device 109a may not process the command.

A similar process may be used to change the value of the second device identifier 133b in the second slave device 109b and the value of the fourth device identifier 133d in the fourth slave device 109d. To this end, the master device 106 may assert a disable signal on the first enable line 203 and an enable signal on the second enable line 206. The first slave interface 129a and the third slave interface 129c may receive the disable signal on the first enable line 203. In response to the disable signal on the first enable line 203, the first slave device 109a and the third slave device 109c may disable at least portions of the first slave interface 129a and the third slave interface 129c, respectively. In response to the enable signal on the second enable line 206, the second slave device 109b and the fourth slave device 109d may enable at least portions of the second slave interface 129b and the fourth slave interface 129d. Thus, data transmitted on the shared data line 123 may be received by the second slave device 109b and the fourth slave device 109d.

The master device 106 may then transmit a command to change the second device identifier 133b or the fourth device identifier 133d prefaced by a value that corresponds to the particular device identifier 133b or 133d that is to be changed. Thus, the second device identifier 133b of the second slave device 109b may be changed while the fourth device identifier 133d of the fourth slave device 109d is maintained. Further, the fourth device identifier 133d in the fourth slave device 109d may be changed while the second device identifier 133b in the second slave device 109b may be maintained.

After one or more of the device identifies 133a-133d have been changed, the master device 106 may assert an enable signal on the first enable line 203 and the second enable line 206. In response, the first slave device 109a, the second slave device 109b, the third slave device 109c, and the fourth slave device 109d may receive the enable signal and enable their respective slave interfaces 129a-129d. The master device 106 may transmit various commands and/or data prefaced with a value corresponding to the particular one of the device identifiers 133a-133d of the slave devices 109a-109d to which the command and/or data is intended to be transmitted. Because the slave devices 109a-109d now have different device identifiers 133a-133d, a command or data intended for one of the slave devices 109a-109d may not be processed by the other slave devices 109a-109d.

In some embodiments, the first slave device 109a and the second slave device 109b may have their initial device identifiers 133a-133b maintained, and the master device 106 may issue a command to the first slave device 109a without unintentionally issuing a command to the second slave device 109b. To this end, the master device 106 may, for example, assert an enable signal on the first enable line 203 while asserting a disable signal on the second enable line 206. Thereafter, the master device 106 may issue a command sequence using the initial device identifiers 133a-133b on the shared data line 123. Because the enable pin for the slave interface 129a of the first slave device 109a may receive the enable signal from the first enable line 203, the first slave interface 129a may be powered up, and the second slave interface 129b may be powered down. As such, the first slave device 109a may receive and process the issued command, while the second slave device 109b does not process the command.

Similarly, the master device 106 may issue a command to the second slave device 109b without having the command processed by the first slave device 109a. To this end, the master device 106 may provide a disable signal to the first enable line 203 and an enable signal to the second enable line 206. Thereafter, the master device 106 may provide a command sequence on the shared data line 123, as discussed above. Thus, the second slave device 109b may process the command, while the first slave device 109a may not process the command. Similar processes may be used to have the third slave device 109c process a command without having the fourth slave device 109d process the command and vice versa.

Figure 4A:
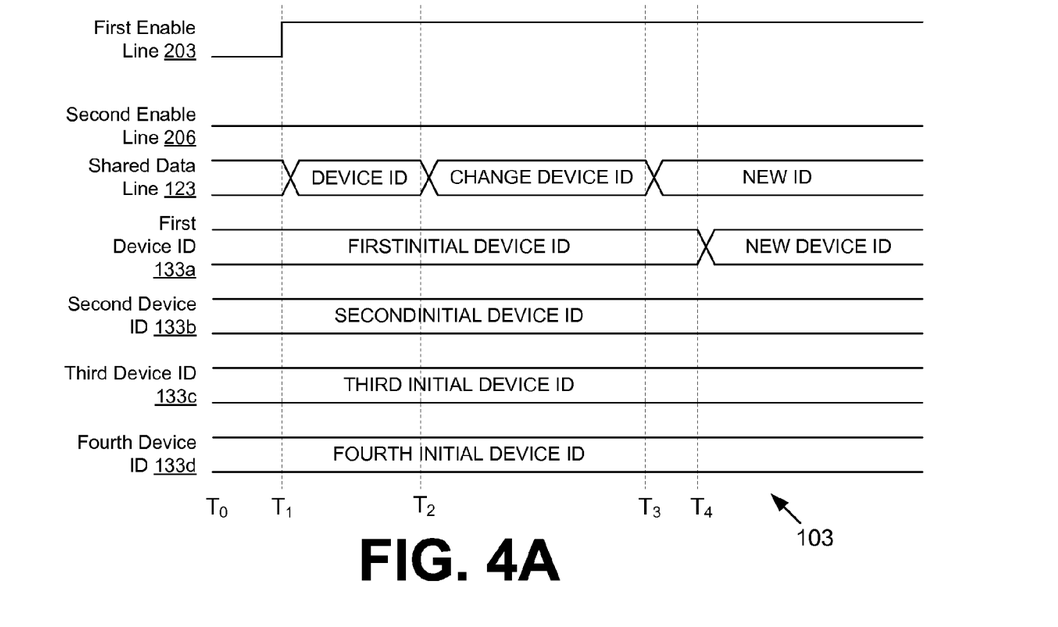
FIGS. 4A-4B are drawings of timing diagrams illustrating examples of functionality executed in the communication device of FIG. 3 according to various embodiments of the present disclosure.

Turning now to FIG. 4A, shown is a drawing of a timing diagram illustrating an example of functionality executed in the communication device 103 of FIG. 3 according to various embodiments of the present disclosure. The timing diagram of FIG. 4A provides merely an example of the many different types of functionality that may be executed in the communication device 103 as described herein. In particular, the timing diagram of FIG. 4A provides an example of the value of the first device identifier 133a being changed while the second device identifier 133b, the third device identifier 133c, and the fourth device identifier 133d have their initial values maintained.

The timing diagram shows graphical representations of functionality regarding the first enable line 203, the second enable line 206, the shared data line 123, the first device identifier 133a, the second device identifier 133b, the third device identifier 133c, and the fourth device identifier 133d. Beginning at time $T_o$, a disable signal is being asserted on the first enable line and the second enable line 206. Additionally, the first device identifier 133a, the second device identifier 133b, the third device identifier 133c, and the fourth device identifier 133d are at their initial values that were set, for example, by their respective manufacturers.

At time $T_1$, an enable signal is asserted on the first enable line 203. In response, at least a portion of the first slave interface 129a (FIG. 1) and the third slave interface 129c (FIG. 1) may be powered up. Also at time $T_1$, a value corresponding to the first device identifier 133a is output to the shared data line 123. Because at least a portion of the first slave interface 129a and the third slave interface 129c have been powered up, the first slave device 109a (FIG. 1) and the third slave device 109c (FIG. 1) receive the value corresponding to the first device identifier 133a. Due to a disable signal being asserted on the second enable line 206, the second slave interface 129b (FIG. 1) and the fourth slave interface 129d (FIG. 1) are powered down and do not process the incoming data.

Because the first slave device 109a may recognize the value that corresponds to the first device identifier 133a, the first slave device 109a may also recognize that an upcoming command is intended for the first slave device 109a. Because the third slave device 109c does not recognize the value that corresponds to the first device identifier 133a, the third slave device 109c may ignore the upcoming command.

At time $T_2$, a command to change the device identifier 133a is output to the shared data line 123. In response, the first slave device 109a prepares to change the first device identifier 133a to the upcoming value. At time $T_3$, the value of the new first device identifier 133a is output to the shared data line 123. In response, the first slave device 109a replaces the initial first device identifier 133a with the new first device identifier 133a at time $T_4$. Thus, the a value for the first device identifier 133a in the first slave device 109a is changed within a time period using the shared data line 123, while the initial values of the second device identifier 133b, the third device identifier 133c, and the fourth device identifier 133d are maintained.

Figure 4B:
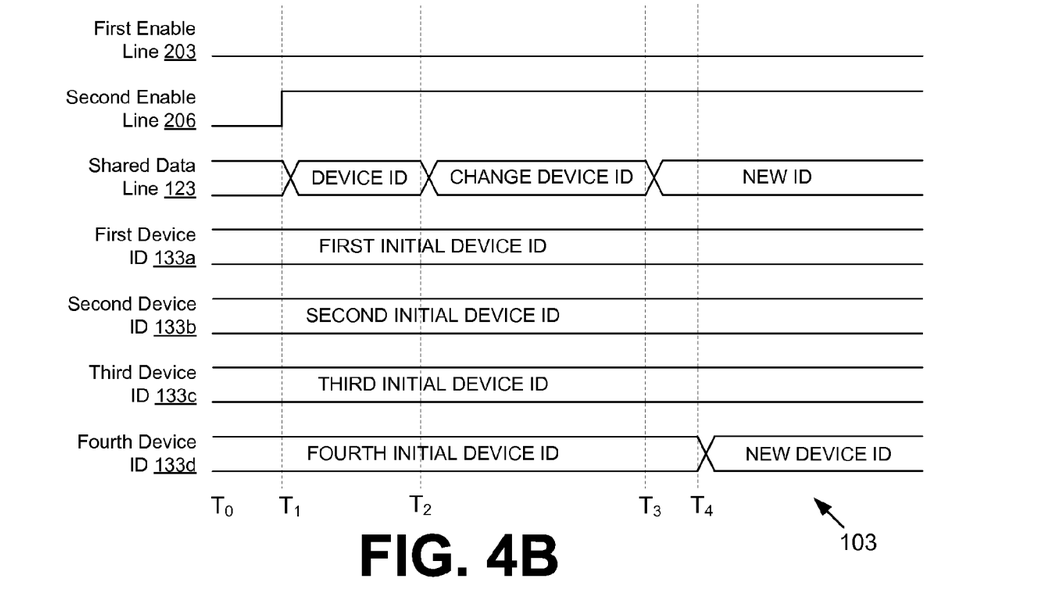

Turning now to FIG. 4B, shown is another drawing of a timing diagram illustrating an example of functionality executed in the communication device 103 of FIG. 3 according to various embodiments of the present disclosure. The timing diagram of FIG. 4B provides merely an example of the many different types of functionality that may be executed in the communication device 103 as described herein. In particular, the timing diagram of FIG. 4B provides an example of a value for the fourth device identifier 133d being changed while values for the first device identifier 133a, the second device identifier 133b, and the third device identifier 133c have their initial values maintained.

The timing diagram shows graphical representations of functionality regarding the first enable line 203, the second enable line 206, the shared data line 123, the first device identifier 133a, the second device identifier 133b, the third device identifier 133c, and the fourth device identifier 133d. Beginning at time $T_o$, a disable signal is being asserted on the first enable line 203 and the second enable line 206. Additionally, the first device identifier 133a, the second device identifier 133b, the third device identifier 133c, and the fourth device identifier 133d are at their initial values that were set, for example, by their respective manufacturers.

At time $T_1$, an enable signal is asserted on the second enable line 206. In response, at least a portion of the second slave interface 129b (FIG. 1) and the fourth slave interface 129d (FIG. 1) may be powered up. Also at time $T_1$, a value corresponding to the fourth device identifier 133d is output to the shared data line 123. Because at least a portion of the second slave interface 129b and the fourth slave interface 129d have been powered up, the second slave device 109b (FIG. 1) and the fourth slave device 109d (FIG. 1) may receive and process the value corresponding to the fourth device identifier 133d. Due to a disable signal being asserted on the first enable line 203, the first slave interface 129a (FIG. 1) and the third slave interface 129c (FIG. 1) are powered down and may not process the incoming data.

Because the fourth slave device 109d may recognize the value that corresponds to the fourth device identifier 133d, the fourth slave device 109d may recognize that an upcoming command is intended for the first slave device 109a (FIG. 1). Because the second slave device 109b does not recognize the value that corresponds to the fourth device identifier 133d, the second slave device 109b may ignore the upcoming command.

At time $T_2$, a command to change the device identifier 133d is output to the shared data line 123. In response, the fourth slave device 109d prepares to change the fourth device identifier 133d to the upcoming value. At time $T_3$, the value for the new fourth device identifier 133d is output to the shared data line 123. In response, the fourth slave device 109d replaces the initial fourth device identifier 133d with the new fourth device identifier 133d at time $T_4$. Thus, the value for the fourth device identifier 133d in the fourth slave device 109d is changed within a time period using the shared data line 123, while the initial values of the first device identifier 133a, the second device identifier 133b, and the third device identifier 133c are maintained. Thereafter, the process ends.

Figure 5:
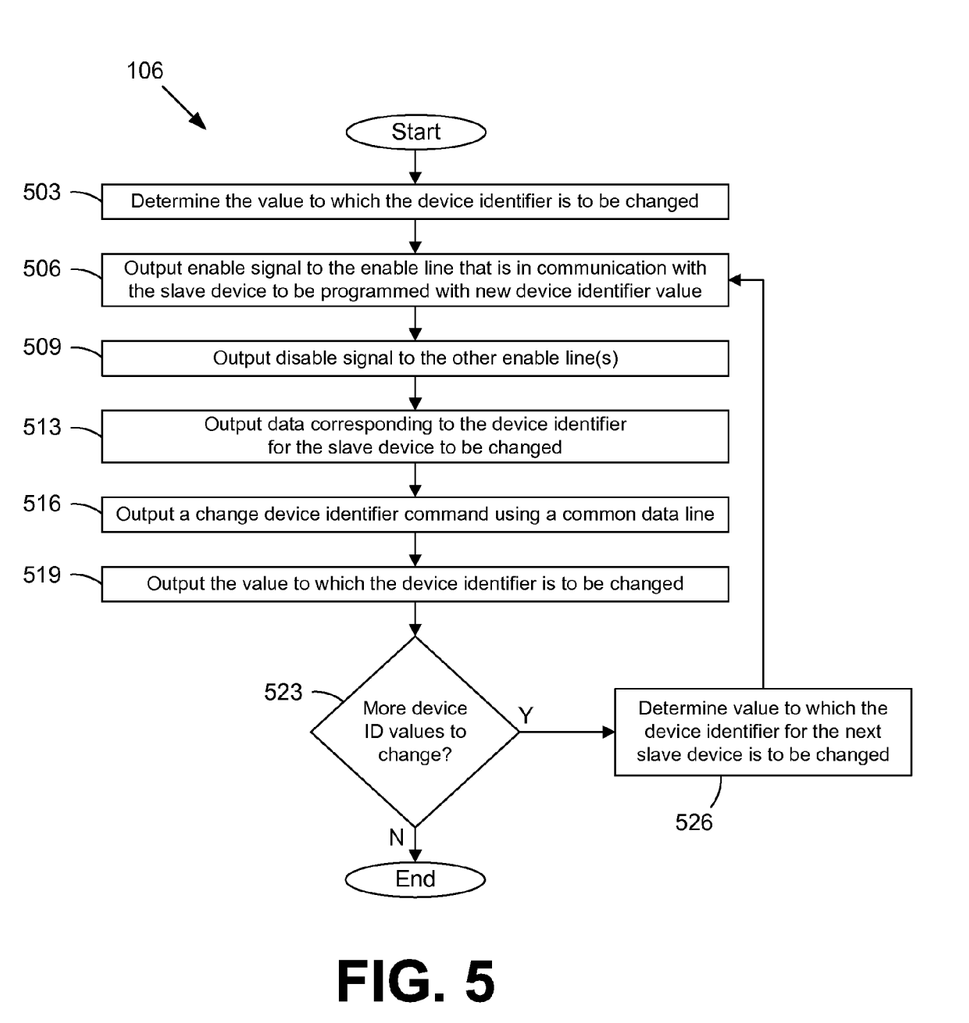
FIG. 5 is a flowchart illustrating an example of functionality executed in the communication device of FIG. 3 according to various embodiments of the present disclosure.

Referring next to FIG. 5, shown is a flowchart that provides one example of the operation of the master device 106 according to various embodiments. The flowchart of FIG. 5 provides merely an example of the many different types of functional arrangements that may be employed to implement the operation of the master device 106 as described herein. The flowchart of FIG. 5 may be viewed as depicting an example of steps of a method implemented in the master device 106 according to one or more embodiments.

Beginning with block 503, the master device 106 determines the particular value for one of the device identifiers 133a-133d (FIG. 3) to be changed. As shown in block 506, the master device 106 then outputs an enable signal to the first enable line 203 (FIG. 3) or the second enable line 206 (FIG. 3) that is in communication with the particular one of the slave devices 109a-109d (FIG. 3) that is to be programmed with the new device identifier value. For instance, if the first slave device 109a (FIG. 3) or the third slave device 109c (FIG. 3) is to have the value of its device identifier 133a or 133c changed, the master device 106 may output an enable signal to the first enable line 203. As another example, if the second slave device 109b (FIG. 3) or the fourth slave device 109d (FIG. 3) is to have the value of its device identifier 133b or 133d changed, the master device 106 may output an enable signal to the second enable line 206.

At block 509, the master device 106 outputs a disable signal to the other enable lines. For instance, if the first enable line 203 is enabled in block 506, the second enable line 206 (and other enable lines if applicable) may be disabled. As shown in block 513, the master device 106 then outputs data corresponding to the one of the device identifiers 133a-133d for the particular one of the slave devices 109a-109d that is to have the value of its device identifier 133a-133d changed. The master device 106 then outputs a change device identifier command using the shared data line 123 (FIG. 3), as depicted in block 516. Thus, in block 516, the master device 106 outputs a change device identifier command to the first slave device 109a and the second slave device 109b using the shared data line 123 in connection with the first slave device 109a and the second slave device 109b (FIG. 3). Also in block 516, the master device 106 outputs the change device identifier command to the third slave device 109c and the fourth slave device 109d using the shared data line 123 in connection with the third slave device 109c and the fourth slave device 109d.

As shown in block 519, the master device 106 outputs the value to which the particular one of the device identifiers 133a-133d is to be changed. Thus, after block 519, the value of the first device identifier 133a in the first slave device 109a, for example, may have been replaced within a time period using the shared data line 123. Additionally, after block 519, the values of the second device identifier 133b, the third device identifier 133c, the fourth device identifier 133d, and others may be maintained during the time period when the first device identifier 133a was changed.

At block 523, the master device 106 determines whether there are more device identifiers 133a-133d to change. If so, the master device 106 moves to block 526 and determines the value to which the one of the device identifiers 133a-133d for the next one of the slave devices 109a-109d is to be changed. The master device 106 then moves to block 506, and the process is repeated as shown. Thereafter, the process ends.

The flowchart of FIG. 5 shows the functionality and operation of portions of the master device 106. If portions are embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in the communication device 103 (FIG. 3). The machine code may be converted from the source code, etc. If embodied in hardware, each block may represent a circuit or a number of interconnected circuits to implement the specified logical function(s).

Although the flowchart of FIG. 5 shows a specific order of execution, it is understood that the order of execution may differ from that which is depicted. For example, the order of execution of two or more blocks may be varied relative to the order shown. Also, two or more blocks shown in succession in FIG. 5 may be executed concurrently or with partial concurrence. Further, in some embodiments, one or more of the blocks shown in FIG. 5 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Various systems described herein may be embodied in general-purpose hardware, dedicated hardware, software, or a combination thereof. If embodied in hardware, each block in FIG. 5 can be implemented as a circuit or state machine that employs any one of or a combination of a number of technologies. These technologies may include, but are not limited to, discrete logic circuits having logic gates for implementing various logic functions upon an application of one or more data signals, application specific integrated circuits (ASICs) having appropriate logic gates, one or more programmable logic devices (e.g., a field programmable gate array (FPGA), a complex programmable logic device (CPLD), etc.), or other components, etc. Such technologies are generally well known by those skilled in the art and, consequently, are not described in detail herein.

It is emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A system, comprising:
   a first slave device comprising a first device identifier value therein;
   a second slave device comprising a second device identifier value therein;
   a third slave device comprising a third device identifier value therein;
   a fourth slave device comprising a fourth device identifier value therein; and
   a master device coupled to the first slave device and the second slave device using a shared data line and a first enable line, the master device being coupled to the third slave device and the fourth slave device using the shared data line and a second enable line, wherein the master device is configured to:
   change the first device identifier value in the first slave device within a time period using the shared data line;
   maintain the second device identifier value in the second slave device during the time period;
   maintain the third device identifier value in the third slave device during the time period; and
   maintain the fourth device identifier value in the fourth slave device during the time period.

2. The system of claim 1, wherein the first device identifier value and the second device identifier value have a same initial value.

3. The system of claim 1 wherein the first slave device and the second slave device have a same device model number.

4. The system of claim 1, wherein the master device replaces the first device identifier value in the first slave device by at least enabling at least a portion of the first slave device using the first enable line during the time period; and
   wherein the master device maintains the second device identifier value in the second slave device by at least disabling at least a portion of the second slave device using the second enable line during the time period.

5. The system of claim 1, wherein the first slave device and the second slave device are at least a part of a radio frequency front end in a wireless communication device.

6. The system of claim 1, wherein the master device, the first slave device, and the second slave device are configured to communicate in conformance with a MIPI radio frequency front end specification.

7. A method, comprising:
   outputting, from a circuit, a change device identifier command to a first slave device, a second slave device, a third slave device, and a fourth slave device using a shared data line in connection with the first slave device, the second slave device, the third slave device, and the fourth slave device, the first slave device comprising a first device identifier value therein, the second slave device comprising a second device identifier value therein, the third slave device comprising a third device identifier value therein, the fourth slave device comprising a fourth device identifier value therein;
   replacing the first device identifier value in the first slave device within a time period using the shared data line;
   maintaining the second device identifier value in the second slave device during the time period;
   maintaining the third device identifier value in the third slave device during the time period; and
   maintaining the fourth device identifier value in the fourth slave device during the time period.

8. The method of claim 7, wherein replacing the first device identifier value in the first slave device further comprises enabling at least a portion of the first slave device during the time period using a first enable line in connection with the first slave device; and
wherein maintaining the second device identifier value in the second slave device further comprises disabling at least a portion of the second slave device during the time period using a second enable line in connection with the second slave device.

9. The method of claim 7, wherein maintaining the fourth device identifier value in the fourth slave device further comprises disabling at least a portion of the fourth slave device during the time period.

10. The method of claim 8, wherein the circuit, the first slave device, and the second slave device are in communication in conformance with a MIPI radio frequency front end specification.

11. The method of claim 7, wherein the first device identifier value and the second device identifier value have a same initial value.

12. The method of claim 7, wherein the first slave device and the second slave device have a same device model number.

13. The method of claim 7, wherein the method is executed in a radio frequency front end for a mobile communication device.

14. A system comprising:
a first plurality of slave devices;
a second plurality of slave devices;
a master device in communication with the first plurality of slave devices via a first enable line and a data line, the master device being in communication with the second plurality of slave devices via a second enable line and the data line, wherein the master device is configured to:
enable, using the first enable line, at least a portion of each of the first plurality of slave devices during a time period;
disable, using the second enable line, at least a portion of each of the second plurality of slave devices during the time period;
transmit, using the data line, a change device identifier command to the first plurality of slave devices and the second plurality of slave devices during at least a portion of the time period; and
wherein a first device identifier value of a first one of the first plurality of slave devices is replaced in response to the change device identifier command, and a second device identifier value of a second one of the second plurality of slave devices is maintained during the time period.

15. The system of claim 14, wherein the first plurality of slave devices and the second plurality of slave devices are at least a part of a radio frequency front end in a wireless communication device.

16. The system of claim 14, wherein the master device is configured to communicate with the first plurality of slave devices and the second plurality of slave devices in conformance with a MIPI radio frequency front end specification.

17. The system of claim 14, wherein the second one of the second plurality of slave devices comprises an input/output voltage (VIO) pin that is coupled to the second enable line, wherein the VIO pin provides a voltage supply to a slave interface of the second one of the second plurality of slave devices.

18. The system of claim 14, wherein the first device identifier value and the second device identifier value are identical prior to the first device identifier value being replaced.

19. A method comprising:
enabling, using a first enable line, at least a portion of each of a first plurality of slave devices during a time period;
disabling, using a second enable line, at least a portion of each of a second plurality of slave devices during the time period;
transmitting, using a data line, a change device identifier command to the first plurality of slave devices and the second plurality of slave devices during at least a portion of the time period; and
wherein a first device identifier value of a first one the plurality of slave devices is replaced in response to the change device identifier command, and a second device identifier value of a second one of the second plurality of slave devices is maintained during the time period.

20. The method of claim 19, wherein the first device identifier value and the second device identifier value have a same initial value.

21. The method of claim 19, wherein the first one of the plurality of slave devices and the second one of the plurality of slave devices are at least a part of a radio frequency front end for a wireless communication device.

22. The method of claim 19, wherein the method is executed by a master device for a radio frequency front end of a wireless communication device.

23. The method of claim 19, wherein the method is executed by a baseband integrated circuit for a radio frequency front end of a wireless communication device.

24. The method of claim 19, wherein the method is executed by a radio frequency integrated circuit for a radio frequency front end of a wireless communication device.

* * * * *